United States Patent
Linss et al.

(10) Patent No.: US 8,992,742 B2
(45) Date of Patent: Mar. 31, 2015

(54) METHOD FOR COATING A SUBSTRATE IN A VACUUM CHAMBER HAVING A ROTATING MAGNETRON

(75) Inventors: Volker Linss, Dresden (DE); Tilo Wuensche, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 75 days.

(21) Appl. No.: 13/377,738

(22) PCT Filed: Jun. 28, 2010

(86) PCT No.: PCT/EP2010/059143
§ 371 (c)(1),
(2), (4) Date: Jan. 27, 2012

(87) PCT Pub. No.: WO2010/149790
PCT Pub. Date: Dec. 29, 2010

(65) Prior Publication Data
US 2012/0132517 A1     May 31, 2012

(30) Foreign Application Priority Data

Jun. 26, 2009 (DE) .......................... 10 2009 030 815
Oct. 22, 2009 (DE) .......................... 10 2009 050 412
Nov. 20, 2009 (DE) .......................... 10 2009 053 756

(51) Int. Cl.
C23C 14/34     (2006.01)
C23C 14/00     (2006.01)
C23C 14/35     (2006.01)
C23C 14/54     (2006.01)

(52) U.S. Cl.
CPC ............. *C23C 14/0036* (2013.01); *C23C 14/35* (2013.01); *C23C 14/54* (2013.01); *C23C 14/0042* (2013.01)

USPC ................................. 204/192.12; 204/192.13

(58) Field of Classification Search
USPC .............................. 204/192.1, 192.12, 192.13
See application file for complete search history.

(56) References Cited

U.S. PATENT DOCUMENTS 4,931,169 A * 6/1990 Scherer et al. ............ 204/298.11
5,108,569 A * 4/1992 Gilboa et al. ............ 204/192.13
(Continued)

FOREIGN PATENT DOCUMENTS

DE    10 2004 060 670 A1    6/2006
JP        2006316340 A       11/2006
(Continued)

OTHER PUBLICATIONS

J. Affinito et al., Mechanisma of voltage controlled, reactive planar magnetron sputtering of Al in Ar/N2 and Ar/O2 atmospheres, J. Vac. Sci. Technol. A2, 1275 (1984).*
(Continued)

*Primary Examiner* — John Brayton
(74) *Attorney, Agent, or Firm* — Heslin Rothenberg Farley & Mesiti P.C.

(57) ABSTRACT

In a method for coating a substrate in a vacuum chamber having a rotating magnetron, wherein a substrate is guided past the magnetron in a substrate transport direction and is coated by a material, which has been isolated from a target connected to the magnetron, and, optionally with the material reacting with a reactive gas present in the vacuum chamber, homogeneity of the coating layer on a substrate is improved by stabilizing the working point by way of the target rotation. This is achieved in that a periodic change of a first process parameter caused by the target revolution is compensated for by a periodic change of a second process parameter having a determined level and/or by employing two magnetrons having different rotational speeds.

15 Claims, 3 Drawing Sheets

(56) References Cited

U.S. PATENT DOCUMENTS

| | | | |
|---|---|---|---|
| 5,292,417 A * | 3/1994 | Kugler | 204/192.13 |
| 5,814,195 A * | 9/1998 | Lehan et al. | 204/192.12 |
| 5,942,089 A * | 8/1999 | Sproul et al. | 204/192.13 |
| 6,106,676 A * | 8/2000 | Terry et al. | 204/192.13 |
| 6,488,824 B1 * | 12/2002 | Hollars et al. | 204/192.22 |
| 6,537,428 B1 | 3/2003 | Xiong et al. | |
| 2002/0046943 A1 | 4/2002 | Echizen et al. | |
| 2010/0200395 A1 * | 8/2010 | Dietrich et al. | 204/192.15 |

FOREIGN PATENT DOCUMENTS

| | | |
|---|---|---|
| WO | 92/01081 A1 | 1/1992 |
| WO | 03/081634 A2 | 10/2003 |

OTHER PUBLICATIONS

International Search Report for PCT/EP2010/059143, dated Sep. 29, 2010.

Sproul et al. "Control of Reactive Sputtering Processes." Thin Solid Films. vol. 491, issue 1-2, pp. 1-17. Nov. 22, 2005.

German National Examination Report for 10 2009 061 065.0 dated Dec. 20, 2012.

Affinito, J. et al., "Mechanisms of voltage controlled, reactive, planar magnetron sputtering of Al in Ar/N2 and Ar/O2 atmospheres", J. Vac. Sci. Technol. A 2(3), Jul.-Sep. 1984, pp. 1275-1284.

National Examination Report issued for corresponding Korean patent application No. 10-2012-7002137 dated Jan. 3, 2014.

National Examination Report issued for corresponding Japanese application No. 2012-516775 dated Aug. 6, 2013.

* cited by examiner

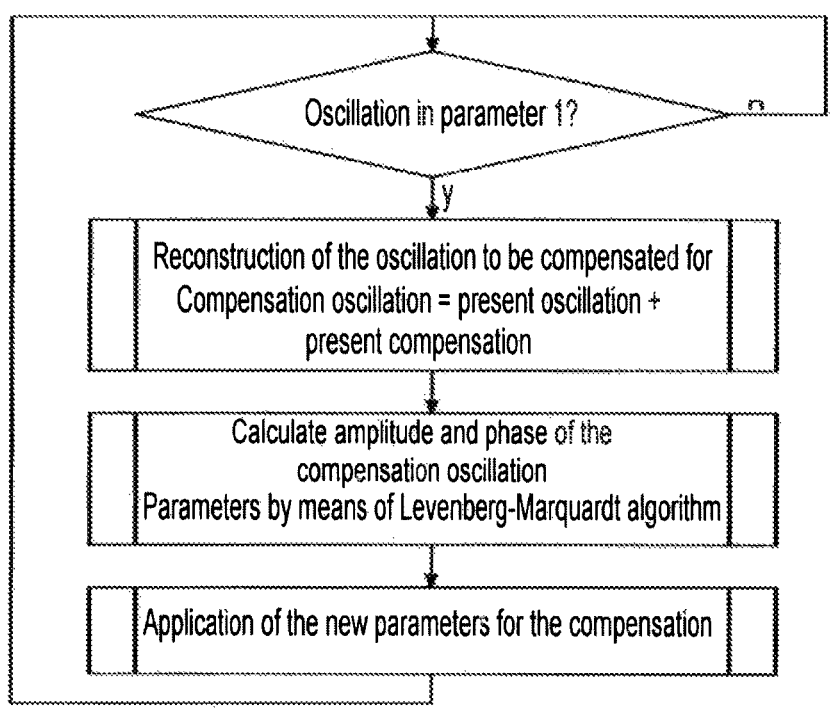

METHOD FOR COATING A SUBSTRATE IN A VACUUM CHAMBER HAVING A ROTATING MAGNETRON

CROSS REFERENCE TO RELATED APPLICATIONS

This application is a national stage filing under section 371 of International Application No. PCT/EP2010/059143 filed on Jun. 28, 2010, and published in German on Dec. 29, 2010 as WO 2010/149790 A2 and claims priority of German application No. 10 2009 030 815.6 filed on Jun. 26, 2009, German application No. 10 2009 050 412.5 filed on Oct. 22, 2009 and German application No. 10 2009 053 756.2 filed on Nov. 20, 2009, the entire disclosure of these applications being hereby incorporated herein by reference.

BACKGROUND ART

The invention relates to a method for coating a substrate in a vacuum chamber having a rotating magnetron, wherein a substrate is guided past the magnetron in a substrate transport direction and is coated by means of a material detached from a target connected to the magnetron, if appropriate also with a reaction of the material with a reactive gas situated in the vacuum chamber.

It is known to produce layers by means of reactive sputtering. In this case, in a high vacuum, a voltage, usually a voltage of alternating polarity, is applied to a target. The target is permeated by a magnetic field, as a result of which the sputtering effect produced by high vacuum and target voltage is made possible or supported. The combination of target and magnetic field generator is designated as a magnetron, and the sputtering is hence designated as magnetron sputtering.

A gas is then introduced into the process space in a targeted manner, said gas reacting chemically with the target material. The reaction product then deposits on a surface of a substrate. This is referred to as reactive sputtering. Oxidic layers, for example, are obtained by introducing oxygen as reaction gas. It is thus possible, for example, to produce a ZnO:Al layer from a Zn:Al target by means of this reactive sputtering.

In practise, so-called tubular magnetrons have proved to be very worthwhile. In this case, a tube-shaped target (tubular target) is provided, in the inner cavity of which the magnetic field generator or the magnetic system is arranged. During the sputtering process, the tubular target is rotated, such that it rotates continuously around the stationary magnetic field. What is thus achieved is that the entire target surface is always processed by the sputtering process. Therefore, unlike in the case of a planar target, it is not possible for zones of different target removal or different target oxidation to form. This ensures, inter alia, that the target is uniformly sputtered, as a result of which better target utilization is achieved.

Tubular magnetrons are usually used in inline vacuum coating installations. These are longitudinally extended vacuum installations comprising a substrate transport system, by means of which substrates are moved through the vacuum coating installation whilst passing through various processing stations, inter alia including tubular magnetron coating stations.

However, such tubular magnetrons can never be manufactured and installed completely cylindrically. In practical use this leads to a fluctuation of the magnetic field at the target surface currently situated above the magnetic system. This is associated with a fluctuation in the operating point.

Operating point is understood here to mean a point on a multidimensional current-voltage characteristic curve set dependent on a plurality of process parameters. A specific desired point or desired region in the characteristic curve set at which the operating point is intended to lie is predefined in order to achieve specific layer qualities, that is to say that the operating point is normally set such that an optimum of layer properties to be obtained is achieved.

Particularly in the case of reactive processes, the influence of the process parameters on the characteristic curve set is particularly strong or not unambiguous, which is manifested in the form of sudden changes or hystereses. This has the effect that minimal fluctuations of the magnetic field which lead to minimal fluctuations in the impedance entail considerable operating point fluctuations.

A fluctuation of the operating point then has the consequence, particularly in the case of reactive processes, that the layer properties on the substrate fluctuate along the transport direction and that the optimum is rarely attained. Parameters of the layer properties can be, for example, transmission and resistance of the deposited layer. In the case of a fluctuation of the operating point, a mixed layer is then deposited at the substrate continuously passing through, with which mixed layer the optimum of transmission and of resistance can never be attained. By way of example, it has not been possible heretofore, during the reactive production of ZnO:Al layers by the tubular magnetron to get beyond an unsatisfactory degree of transmission.

In the process control, the operating point is kept constant if possible. Regulating methods are known for this purpose, for example plasma emission monitoring (PEM), developed by the applicant, or a power regulation by means of reaction gas feeding with a voltage regulated such that it is constant.

During the power regulation, the generator used for providing the target voltage is operated in a voltage-regulated fashion and the desired power is set by means of the reactive gas flow rate, in particular the oxygen flow rate. When a tubular magnetron is used, during the tube rotation the changes in the magnetic flux at the target surface can result in the readjustment of the reactive gas flow rate, in particular of the oxygen flow rate, while the power can be kept very constant.

However, the regulation of the reactive gas flow rate is also associated with the change of other variables, when producing a ZnO:Al layer the intensity of the Zn line in the optical emission spectrum. That has the effect that, despite very good constancy of the voltage and the power, the operating point is varied by way of the tube rotation and the mixed layers already described occur, in which good properties are combined with poor properties.

If, by way of example, a specific resistance is intended to be set, then said resistance is determined by the high-resistance portion in the layer. Consequently, a limit value of the resistivity has to be undershot in the entire layer. However, the rotation has the effect that one part of the layer is deposited with high resistance but, upon further rotation of the tube, another part is also deposited with low resistance.

Therefore, the operating point has to be tracked by means of the tube rotation, which is not successful solely with oxygen flow rate and power regulation.

The object of the invention, then, consists in improving the homogeneity of the layer on a substrate by means of the target rotation.

BRIEF SUMMARY OF INVENTION

The invention provides a regulation of the operating point of the coating process, in the case of which a target voltage is applied to a tubular magnetron with a rotating target and a counterelectrode, in such a way that a periodic change in a first process parameter caused by the target rotation is corrected by a periodic change in a second process parameter with a determined level.

Specifically, it has been found that, by influencing the target voltage, it is possible to correct the profile of the first process parameter by means of a second process parameter, which is independent of the first process parameter.

A first variant of the method according to the invention provides for a periodic change in the first process parameter caused by the target rotation to be corrected by a periodic change in the target voltage U (second process parameter) by $+\Delta U$ and $-\Delta U$.

In this case, in particular, the absolute value $|\Delta U|$ of the change $\Delta U$ can be less than the absolute value $|U|$ of the target voltage U.

The intensity of a significant line of an optical emission spectrogram can be used as first process parameter.

Another possibility provides for the reactive gas partial pressure to be used as first parameter.

The method can be used in both forms of the target voltage, in which the voltage is a DC or an AC voltage.

Preferably, a periodic fluctuation of the first process parameter is compensated for by virtue of the fact that the period duration of the change in the target voltage U corresponds to a target rotation, wherein the target voltage can be changed out sinusoidally or in a form deviating from the sinusoidal form, depending on the embodiment of the first process parameter.

A further configuration of the method according to the invention utilizes the control possibility of the voltage sources usually used, which is actually provided for stabilizing the configuration by virtue of the fact that the target voltage is applied as a voltage regulated by means of a voltage regulation and the power consumed by the tubular magnetron is kept constant by a regulation of the reactive gas flow rate.

In this case, it is possible that the periodic voltage change is produced by a variation at the control input of the voltage regulation.

Another configuration of the method according to the invention provides for a periodic change in the first process parameter caused by the target rotation to be corrected by a periodic change in the total pressure (second process parameter).

In this case, the intensity of a significant line of an optical emission spectrogram or the reactive gas partial pressure can be used as first process parameter.

However, it is also possible to include further process parameters in the method according to the invention by virtue of the fact that a periodic change in a first process parameter and/or in a third process parameter caused by the target rotation is corrected by a periodic change in a second process parameter and/or in a fourth process parameter with a determined level in each case, wherein the partial pressure of the reactive gas or the intensity of a significant line or the intensity ratio of two lines of an optical emission spectrogram can be used as first or third process parameter, or the voltage or the total pressure can be used as second or fourth process parameter.

In another case, in order to compensate for periodic fluctuations, it is provided that at least two magnetrons are used which are driven with rotational speeds that are at least different from one another. The effect of the compensation can also be intensified by the fact that both magnetrons (7) are driven in mutually opposite directions of rotation.

A particularly outstanding effect is achieved if the two methods according to the invention are combined with one another.

BRIEF DESCRIPTION OF DRAWING FIGURES

The invention will be explained in greater detail below on the basis of an exemplary embodiment.

DETAILED DESCRIPTION

In the associated drawings:

FIG. 4 shows an algorithm for the automated calculation of the periodic compensation function.

Figure 1:
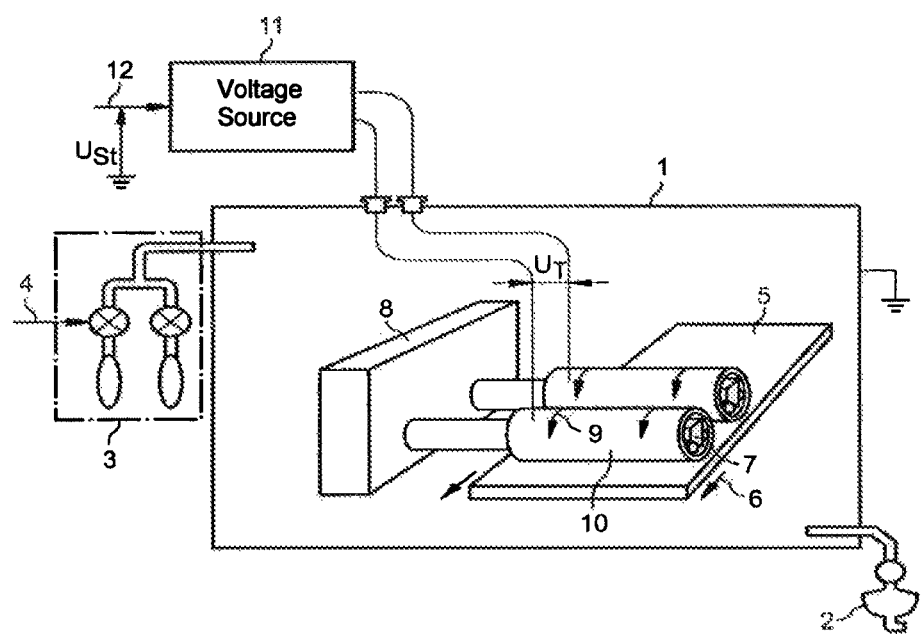
FIG. 1 shows a schematic illustration of a vacuum chamber with an arrangement of cylindrical magnetrons.

FIG. 1 illustrates the prior art and shows a vacuum chamber 1 connected to a vacuum pump 2. Furthermore, the vacuum chamber 1 is connected to a gas source 3 having a control input 4 for controlling the gas flow into the vacuum chamber 1. The vacuum chamber 1 is part of a longitudinally extended vacuum coating installation through which a substrate 5 is moved in the longitudinal and hence transport direction 6. This serves for treating a plurality of substrates 5 in continuous operation. In this case, the substrates 5 can be treated in different ways. The treatment step of coating is of interest here.

For coating the substrate 5, at least one cylindrical magnetron 7 is provided which is mounted in an end block 8 and is driven via the latter in a rotary fashion in the direction of rotation 9. For the sputtering of the target 10 which is situated on the outside of the magnetron 7 and which is intended to be deposited on the substrate 5 (if appropriate with reaction with a reactive gas introduced by means of the gas source 3), a target voltage $U_T$ is applied to the target 10. For this purpose, the target 10 is connected to a voltage source 11 (very generally via the magnetron 7). The voltage source has an internal voltage regulation provided with a voltage control input 12. The control voltage $U_{St}$ applied to the voltage control input 12 predefines the level of the output voltage of the voltage source 11 as provided target voltage $U_T$. Given a constant voltage value of the control voltage $U_{St}$ at the voltage control input 12, the target voltage $U_T$ is kept constant in a highly precise manner.

The target voltage $U_T$ can have different forms and can be applied in different ways. Thus, it is possible for the target voltage $U_T$ to be provided as a DC voltage, wherein the DC voltage can also be generated as a pulsating DC voltage. If only a single magnetron 7 is provided, then the target voltage $U_T$ is applied between the magnetron 7 as cathode and the vacuum chamber 1 as anode or a separate anode.

However, an AC voltage as target voltage $U_T$ can also be applied to a single magnetron 7, wherein the vacuum chamber 1 can then likewise serve as counterelectrode or a separate counterelectrode can be provided.

If two magnetrons 7 are used, as is illustrated in FIG. 1, each magnetron can be operated with a DC or AC voltage as respective target voltage $U_T$, precisely in the manner as described above for a single magnetron. However, it is also possible to apply the target voltage $U_T$ between both magnetrons 7 as AC voltage. This represents the preferred variant, wherein the AC voltage is configured as a medium-frequency AC voltage, the frequency of which is very generally between one and a plurality of kHz. The control of the target voltage $U_T$ according to the invention can be used for all kinds of magnetron driving and voltage types illustrated.

Figure 2:
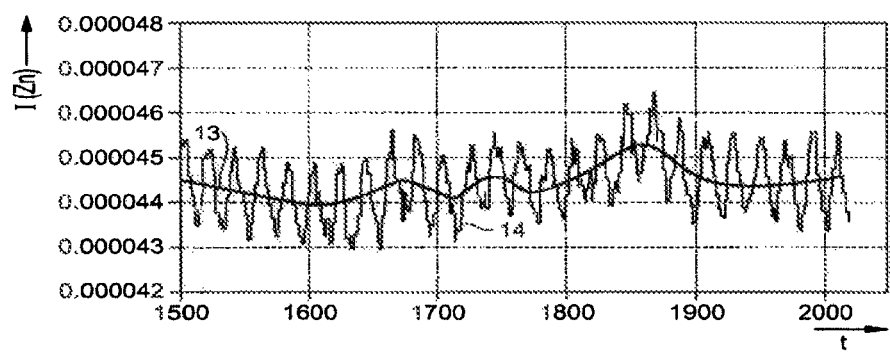
FIG. 2 shows the behavior of the intensity of an emission spectral line of Zn according to the prior art.

FIG. 2 shows the conventional behavior of a process parameter in the case of a rotating target 10 according to the prior art. In this example, as reactive gas from the gas source 3 oxygen is used in a manner controlled in terms of its gas flow by means of the control input 4. The partial pressure of the reactive gas oxygen is thus considered. As explained above, however, other process parameters or else a combination of different process parameters can also be used here, such as, for example, the intensity of a significant spectral line. In the case of a deposition of ZnO:Al, by way of example the intensity of the Zn line at 636 nm in the optical emission spectrum could also be considered here.

As is evident, the average value 13 of the oxygen partial pressure changes over the period of time illustrated. This results from the fact that, with target voltage $U_T$ kept constant, the power is kept constant by means of the supply of oxygen. This leads to different oxygen partial pressures, which can be discerned in FIG. 1 as a fluctuating average value 13. This is a normal process behavior.

What is crucial is that the oxygen partial pressure changes much more greatly in significantly shorter periods. This can be discerned as curve 14 with the significantly faster fluctuation of the oxygen partial pressure around its average value 13 and is an expression of a different process behavior in the case of a rotating target 10. The period duration of the curve 14 with the short fluctuation of the oxygen partial pressure corresponds to the revolution of the cylindrical target 10. This great fluctuation of the oxygen partial pressure is at the same time also an expression of a greatly fluctuating operating point, which leads to a different layer deposition over time.

If a substrate 5 is then guided past a magnetron 7 in a coating installation, as was outlined in the introduction, different coating zones will arise, which can cause a striated appearance. The layer produced is therefore not homogeneous over the area.

In a first method according to the invention, the control input 12 of the voltage regulation for the target voltage $U_T$ is now used to vary the voltage at the output of the voltage source 11 by the control input 12 being correspondingly manipulated. The target voltage $U_T$ previously kept constant is correspondingly influenced.

In this case, the output voltage of the voltage supply, that is to say the target voltage $U_T$ provided, is increased and decreased by an absolute value $\Delta U$ cyclically with a period duration. By varying $\Delta U$ and the period duration of the voltage change, what is then achieved is that, by means of a periodically changing target voltage, the fluctuation of the operating point caused by the target rotation is reduced or even eliminated, which becomes clear in the behavior of the oxygen partial pressure in the time range starting from approximately 2000 s in FIG. 3. In this time range, the oxygen partial pressure, with the exception of slight "noise", changes only in the normal process behavior, as outlined with regard to FIG. 1.

If the method according to the invention is regarded as regulation by closed-loop control, then in this case the controlled variable is the amplitude of a periodic change in the oxygen flow rate and the manipulated variable is the amplitude and period duration and also the phase of a modulation of the target voltage $U_T$. It should be taken into account here that the invention also includes other process parameters as controlled or manipulated variables. Besides the possibilities already mentioned for the controlled variables, by way of example the reactive gas flow rate, the total pressure or the like can also be used as manipulated variables.

Figure 3:
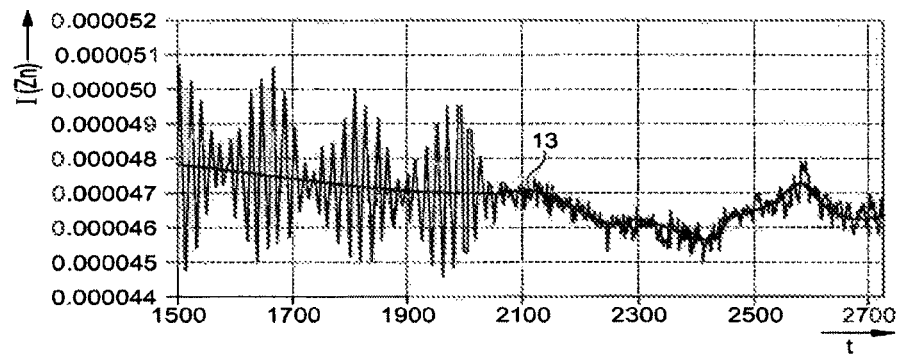
FIG. 3 shows the behavior of the intensity of an emission spectral line of Zn upon application of the method according to the invention.

In FIG. 3, a large fluctuation with a large fluctuation range can be discerned from the time period before successful regulation. This results from the fact that although the magnitude of $\Delta U$ was set correctly during this time period, which can be recognized from the amplitude in the beat nodes, the period duration of the voltage change $\Delta U$ was not set correctly. With a synchronization of the frequency of the target voltage fluctuation to the revolution frequency of the tubular target or targets 10, the behavior of the partial pressure on the right-hand side is then achieved, whereby sufficient homogeneity in the layer deposition can be achieved.

In this exemplary embodiment, the automated derivation of a compensation of the oscillation in the oxygen partial pressure is described by a sinusoidal modulation of the target voltage. The modulation is characterized by the three parameters of amplitude, frequency and phase. In this case, the frequency is obtained from the rotation of the target or targets 10. This can be effected, for example, by means of a measurement of the rotational frequency or from the derivation of the rotational frequency from the operating parameters of the drive magnetron 7. The parameters of amplitude and phase of the compensation oscillation are continuously adapted to the present states. This is effected by the amplitude of the oscillation of the oxygen partial pressure being determined. If the amplitude exceeds a maximum value for a duration of a plurality of periods of the compensation oscillation, the amplitude and the phase have to be calculated anew.

As illustrated in FIG. 4, the calculation is effected such that firstly the oscillation of the oxygen partial pressure that occurs without compensation is calculated from the present oscillation and the compensation modulation. A new amplitude and new phase are calculated from this oscillation with the aid of the Levenberg-Marquardt algorithm. The newly calculated parameters are employed and the renewed check is prevented as long as the renewed check is based on data modulated by the new conditions. The operation of the first start-up is effected such that amplitude and phase of the modulation are set to zero and the algorithm determines the parameters itself with the aid of a test substrate.

The problem described above is also caused, inter alia, by the fact that either a single magnetron 7 is provided, or two magnetrons 7 having the same direction of rotation 9 and the same rotational speed. A second solution according to the invention to the same problem now commences at this point, which solution provides for using at least two magnetrons having rotational speeds that are at least different from one another. What is thus achieved is that the periodic fluctuations of the curve 14 which are illustrated in FIG. 2 are compensated for since the two magnetrons 7 have different rotational speeds and, consequently, addition of the fluctuation profiles no longer occurs. This can also be supported by both magnetrons 7 having mutually opposite directions of rotation.

In a particularly expedient manner, both methods can be combined with one another by measuring the process parameter under consideration as controlled variable and readjusting the target voltage $U_T$ in opposite senses, the two magnetrons 7 having mutually different rotational speeds. A (smaller and no longer sinusoidal) fluctuation of the process parameter under consideration caused by the different rotational speeds is then almost completely eliminated by the regulation configured in this way.

The invention claimed is:

1. A method for applying a coating to a substrate in a vacuum chamber having a tubular magnetron, wherein a target voltage is applied to a rotating tubular target of the magnetron, and wherein a substrate is guided past the magnetron in a substrate transport direction and is coated in a coating process by a material detached from the rotating tubular target of the magnetron, comprising: regulating an operating point of the coating process by applying a periodic change in a second process parameter, the second process parameter comprising the target voltage, the periodic change in the target voltage having a frequency synchronized to frequency of rotation of the rotating tubular target, and a level determined to correct a periodic change in a first process parameter caused by rotation of the target, and wherein the first process parameter comprises at least one of intensity of an emission spectral line of a coating component in an optical emission spectrogram of the coating, a partial pressure of a reactive gas situated in the vacuum chamber, and an intensity ratio of two emission spectral lines of coating components in the optical emission spectrogram, and wherein the periodic change in the target voltage as the second process parameter comprises a positive change and a negative change of equal value wherein an absolute value of the change in target voltage is less than an absolute value of the target voltage, and wherein amplitude and phase of the periodic change in the target voltage are continuously adapted to present states by determining amplitude of the periodic change in the first process parameter.

2. The method as claimed in claim 1, wherein the first process parameter comprises the intensity of an emission spectral line of a coating component in the optical emission spectrogram of the coating.

3. The method as claimed in claim 1, wherein the coating process includes reaction of the material with a reactive gas situated in the vacuum chamber, and wherein the first process parameter comprises a partial pressure of the reactive gas.

4. The method as claimed in claim 1, wherein the target voltage comprises a DC voltage or an AC voltage.

5. The method as claimed in claim 1, wherein the target voltage is changed sinusoidally.

6. The method as claimed in claim 1, wherein the target voltage is changed in a form deviating from a sinusoidal form.

7. The method as claimed in claim 1, wherein the coating process includes reaction of the material with a reactive gas situated in the vacuum chamber, and wherein the target voltage comprises a regulated voltage and power consumed by the tubular magnetron is kept constant by regulation of a flow rate of the reactive gas.

8. The method as claimed in claim 7, wherein the periodic change in the target voltage is produced by a variation at a control input of voltage regulation.

9. A method for applying a coating to a substrate in a vacuum chamber having a tubular magnetron, wherein a target voltage is applied to a rotating tubular target of the magnetron, and wherein a substrate is guided past the magnetron in a substrate transport direction and is coated in a coating process by a material detached from the rotating tubular target of the magnetron, comprising: regulating an operating point of the coating process by applying a periodic change in a second process parameter, the second process parameter comprising total pressure in the vacuum chamber, the periodic change in the total pressure having a frequency synchronized to frequency of rotation of the rotating tubular target, and a level determined to correct a periodic change in a first process parameter caused by rotation of the target, and wherein the first process parameter comprises at least one of intensity of an emission spectral line of a coating component in an optical emission spectrogram of the coating, a partial pressure of a reactive gas situated in the vacuum chamber, and an intensity ratio of two emission spectral lines of coating components in the optical emission spectrogram.

10. The method as claimed in claim 9, wherein the first process parameter comprises intensity of the emission spectral line of a coating component in the optical emission spectrogram of the coating.

11. The method as claimed in claim 9, wherein the coating process includes reaction of the material with a reactive gas situated in the vacuum chamber, and wherein the first process parameter comprises a partial pressure of the reactive gas.

12. The method as claimed in claim 1, wherein a periodic change in a third process parameter is corrected by a periodic change in the second process parameter and/or in a fourth process parameter with a determined level.

13. The method as claimed in claim 12, wherein partial pressure of reactive gas in the vacuum chamber or intensity of an emission spectral line of a coating component or intensity ratio of two spectral lines of coating components in the optical emission spectrogram of the coating is used as the first or the third process parameter.

14. The method as claimed in claim 12, wherein target voltage or total pressure is used as the fourth process parameter.

15. The method as claimed in claim 1, wherein the coating process includes reaction of the material with a reactive gas flowing into the vacuum chamber, and further comprising: regulating rate of flow of the reactive gas into the vacuum chamber to keep constant power consumed by the tubular magnetron.

* * * * *